United States Patent
Melik-Martirosian et al.

(10) Patent No.: US 6,868,014 B1
(45) Date of Patent: Mar. 15, 2005

(54) MEMORY DEVICE WITH REDUCED OPERATING VOLTAGE HAVING DIELECTRIC STACK

(75) Inventors: Ashot Melik-Martirosian, Santa Clara, CA (US); Mark W. Randolph, San Jose, CA (US); Sameer S. Haddad, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 35 days.

(21) Appl. No.: 10/430,604

(22) Filed: May 6, 2003

(51) Int. Cl.[7] .............................................. G11C 16/04
(52) U.S. Cl. .......................... 365/185.28; 365/185.18; 365/185.33
(58) Field of Search ....................... 365/185.18, 185.28, 365/185.29, 185.03, 185.33

(56) References Cited

U.S. PATENT DOCUMENTS 3,992,701 A * 11/1976 Abbas et al. ............... 365/184
6,011,725 A * 1/2000 Eitan ...................... 365/185.33
6,215,702 B1 * 4/2001 Derhacobian et al. .. 365/185.29
6,434,053 B1 * 8/2002 Fujiwara ................ 365/185.28

* cited by examiner

*Primary Examiner*—Gene N. Auduong
(74) *Attorney, Agent, or Firm*—Renner, Otto, Boisselle & Skylar, LLP

(57) ABSTRACT

A non-volatile memory device includes a semiconductor substrate and a pair of buried bitlines within the substrate. A scaled down dielectric stack is formed over the substrate. The scaled down dielectric stack includes a scaled down top dielectric layer, a scaled down charge trapping dielectric layer and a bottom dielectric layer. A wordline is formed over the dielectric stack. The memory device is operative to be programmed using a reduced wordline operating voltage of less than about +8 Volts, and to be erased using a reduced wordline operating voltage of less than about −6 Volts.

21 Claims, 1 Drawing Sheet

MEMORY DEVICE WITH REDUCED OPERATING VOLTAGE HAVING DIELECTRIC STACK

TECHNICAL FIELD

The present invention relates generally to the field of non-volatile memory devices and, more particularly, to a charge trapping dielectric flash electrically erasable and programmable memory device with reduced programming and erase voltages.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, is capable of storing two bits of data in a double-bit arrangement. That is, one bit can be stored using a first charge storing region on a first side of the memory device and a second bit can be stored using a second charge storing region on a second side of the memory device.

In a conventional charge trapping dielectric memory device, the charge storing regions are part of a non-conductive charge trapping layer, which is disposed between a relatively thick (e.g., about 100 angstroms) bottom (or tunnel) dielectric layer and a relatively thick (e.g., about 100 angstroms) top dielectric layer. These dielectric layers can be formed over a P-type conductivity silicon substrate having a series of bitlines disposed therein. A series of conductive wordlines, often made from polycrystalline silicon, can be formed over the dielectric layers to serve as gate electrodes for each memory device. The core memory devices can be addressed by applying appropriate voltages to the wordlines and/or the bitlines.

During programming and reading of the core memory devices, the bitlines can function as sources (i.e., a source of electrons or holes) and drains with an active channel region defined therebetween. Programming of such a memory device can be accomplished, for example, by hot electron injection. Hot electron injection involves applying appropriate voltage potentials to each of the gate electrode (e.g., about 9 Volts to about 11 Volts), the source, and the drain of the memory device for a specified duration until the charge trapping layer accumulates charge.

Where possible, it is desirable to scale down memory devices, while still maintaining desirable qualities, such as adequate data retention, and optimized performance. However, memory device downscaling can result in a number of performance degrading effects. For example, in memory devices with an active channel region having a relatively short length, a memory device can experience a number of undesirable electrical characteristics referred to as short channel effects (SCE). SCE generally occur when the gate electrode does not have adequate control over the active channel region, and can include threshold voltage ($V_T$) roll off, off current ($I_{off}$) roll-up and drain induced barrier lowering (DIBL). As the physical dimensions of the device decrease, SCE can be become more severe.

In view of the foregoing, there is a need in the art for improved memory devices, such as charge trapping dielectric flash memory devices, which optimize scale and performance.

SUMMARY OF THE INVENTION

According to one aspect of the invention, the invention is directed to a memory device. The memory device can include a substrate having a first semiconductor bitline and a second semiconductor bitline formed therein and a body region interposed between the first and second bitlines. A first dielectric layer, which has a thickness, can be disposed over the body region. A charge trapping layer can be disposed over the first dielectric layer and a second dielectric layer can be disposed over the charge trapping layer. The second dielectric layer can have a thickness that is less than the thickness of the first dielectric layer. A wordline, which electrically defines a channel within the body region, can be disposed over the second dielectric layer.

According to another aspect of the invention, the invention is directed to a memory device. The memory device can include a semiconductor substrate and a source and a drain, which can each be formed from bitlines disposed on or within the semiconductor substrate. The source and drain can define a body region therebetween. A charge trapping dielectric stack, which can have a thickness of about 130 angstroms to about 170 angstroms, can be formed over the body region. The charge trapping dielectric stack can include a bottom dielectric layer disposed over the body region, a charge trapping dielectric layer disposed over the bottom dielectric layer, and a top dielectric layer disposed over the charge trapping dielectric layer. A gate electrode, which can electrically define a channel within the body region, can be formed from a wordline disposed over the charge trapping dielectric stack.

According to another aspect of the invention, the invention is directed to a method of programming a non-volatile memory device. The memory device can include a pair of buried bitlines disposed within a semiconductor substrate. The buried bitlines can define a body region therebetween. The memory device can include a bottom dielectric layer formed over the body region and a charge storing layer formed over the bottom dielectric layer. The charge storing layer can have a conductivity such that at least a first charge can be stored in a first charge storing cell adjacent a first buried bitline and at least a second charge can be stored in a second charge storing cell adjacent a second buried bitline. A top dielectric layer can be formed over the charge storing layer and a wordline can be formed over the top dielectric layer. The method of programming can include applying a program voltage of less than about +8 Volts to the wordline, applying a voltage potential of about +3.5 Volts to about +5 Volts to the first bitline, and connecting the second bitline to a zero potential.

According to another aspect of the invention, the invention is directed to a method of erasing a non-volatile memory device. The memory device can include a semiconductor substrate and a source and a drain, which can each be formed from bitlines on or within the semiconductor substrate. The memory device can include a bottom dielectric layer formed over a body region and a charge storing layer formed over the bottom dielectric layer. A top dielectric layer can be formed over the charge storing layer and a wordline can be formed over the top dielectric layer. The method of erasing can include applying a negative erase voltage of about −3 Volts to about −6 Volts to the wordline, and applying a voltage potential of about +4 Volts to about +6 Volts to the first bitline. The method can further include either (i) connecting the second bitline to a zero potential or (ii) floating the second bitline.

BRIEF DESCRIPTION OF DRAWINGS

These and further features of the present invention will be apparent with reference to the following description and drawings, wherein.

DISCLOSURE OF INVENTION

Figure 1:
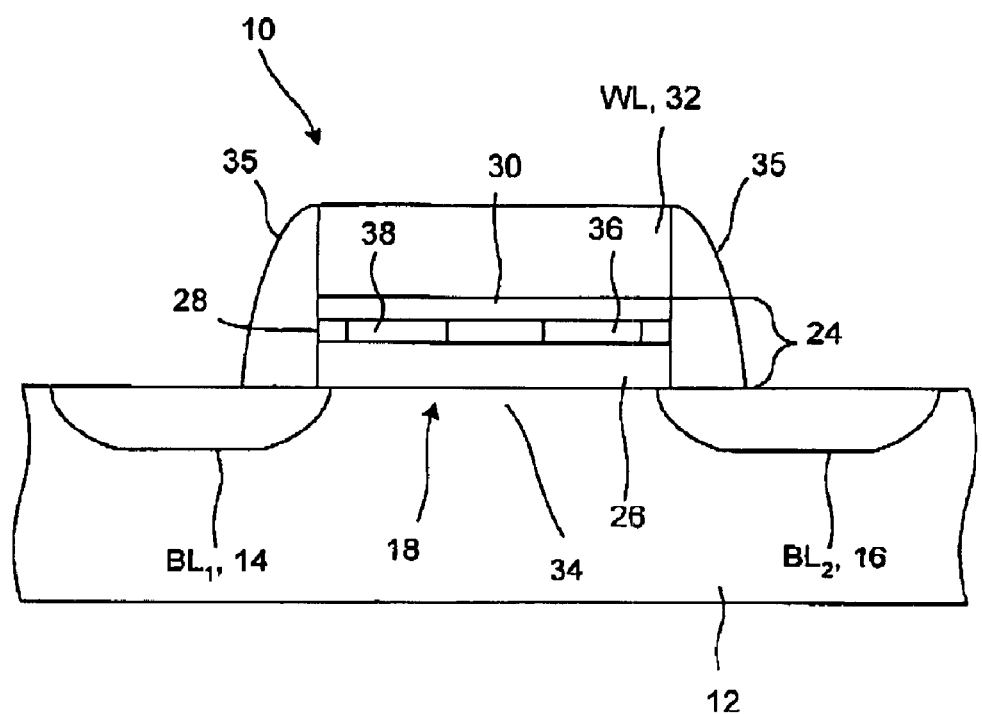
FIG. 1 is a schematic cross-section illustration of a flash memory device having a scaled down dielectric stack in accordance with the present invention.

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

With reference to FIG. 1, an exemplary multiple-bit, charge trapping dielectric, non-volatile, flash electrically erasable and programmable memory device 10 is illustrated. The memory device 10 includes a semiconductor substrate 12. In one embodiment, the substrate 12 can initially be doped to have P-type conductivity (i.e., P dopant concentration). Within the substrate 12, a pair of buried bitlines $BL_1$, $BL_2$ are formed. Each buried bitline $BL_1$, $BL_2$ can be doped to have an N-type conductivity (e.g., $N^+$ dopant concentration). In one embodiment, each buried bitline $BL_1$, $BL_2$ functions as a source 14 and a drain 16, respectively, during various programming, reading, and erasing operations. Alternatively, the source 14 and the drain 16 can be coupled to corresponding bitlines formed on top of the substrate 12.

A body 18 is formed between the source 14 and the drain 16. The body 18 can have the same dopant type and concentration as the initial doping of the substrate 12. The substrate 12, the source 14, the drain 16 and the body 18 can be formed, for example, from a semiconductor, such as appropriately doped silicon, germanium or silicon-germanium.

Above the body 18 is a dielectric stack 24. The dielectric stack 24 includes a first dielectric layer 26 (also referred to as a tunneling dielectric layer or a bottom dielectric layer) that is made from, for example, silicon oxide ($SiO_2$), another standard-K material (e.g., having a relative permittivity below ten) or a high-K material (e.g., having a relative permittivity, in one embodiment, above ten and, in another embodiment, above twenty).

Over the bottom dielectric layer 26 is a charge trapping layer 28 (also referred to as a charge storing layer). The charge trapping layer 28 can be made from, for example, a non-conductive material, including silicon nitride ($Si_3N_4$), silicon oxide with buried polysilicon islands, implanted oxide and the like.

Over the charge trapping layer 28 is another dielectric layer 30 (also referred to as a top dielectric layer) made from a material such as, for example, silicon oxide ($SiO_2$), another standard-K material or a high-K material.

Over the top dielectric layer 30 a wordline WL is formed. In one embodiment, the wordline WL functions as a gate electrode 32, which, in part, controls a channel 34 interposed between the bitlines $BL_1$, $BL_2$. In alternative arrangements, the wordline WL can be formed from interconnected polysilicon gate electrode 32 islands or pads. A work function of the gate electrode 32 and dielectric stack 24 controls the channel 34 (e.g., inversion or depletion states) within the body 18. The wordline WL and/or gate electrode 32 can be made from, for example, polycrystalline silicon (poly) or another appropriate material, such as a metal or metal oxide. Sidewall spacers 35 can be disposed adjacent lateral sidewalls of the gate electrode 32 and dielectric stack 24 for use in controlling dopant implantation, device properties, and the like.

In one embodiment, the top dielectric layer 30 and the charge trapping layer 28 each have a thickness that is less than the thickness of the bottom dielectric layer 26. In one embodiment, the thickness of the charge trapping layer 28 is about 30% to about 75% of the thickness of the bottom dielectric layer, while the thickness of the top dielectric layer is about 50% to about 100% of the thickness of the bottom dielectric layer.

For example, in one embodiment, the top dielectric layer 30 can have a thickness of about 40 angstroms to about 60 angstroms and the charge trapping layer 28 can have a thickness of about 25 angstroms to about 50 angstroms, while the bottom dielectric layer 26 can have a thickness between about 60 angstroms and about 100 angstroms. In another embodiment, the top dielectric layer can have a thickness of about 30 angstroms to about 50 angstroms, while the bottom dielectric layer 26 can have a thickness of about 50 angstroms to about 80 angstroms.

It is noted that this exemplary embodiment provides a dielectric stack 24 having a reduced total thickness (e.g, about 130 angstroms to about 170 angstroms), which can provide a device with numerous advantages, including, but not limited to, greater device scalability, improved operating speed, and reduced operating voltage (e.g., reduced programming voltage applied to the gate electrode 32). In addition, the scaled down dielectric stack 24 alleviates short-channel effects (SCE) in the device, as well as, provides a sufficiently thick bottom dielectric layer 26 to prevent low voltage leakage current and promote data retention with the use of a hot hole injection erase mechanism (described more fully below). The reduced thickness of the dielectric stack 24 allows for better charge control in the substrate by the gate, thus improving SCE.

The memory device 10 is operatively arranged to be programmed, verified, read, and erased by the application of appropriate voltage potentials to each of the wordline WL, which functions as the gate electrode 32, and the buried bitlines $BL_1$, $BL_2$, which each function as the source 14 or the drain 16, depending upon the desired operation.

In one embodiment, the memory device 10 can be configured as a virtual ground device. That is, during various operations of the memory device 10, either of the first bitline $BL_1$ or the second bitline $BL_2$ can function as a source 14 of electrons and either of the first bitline $BL_1$ or the second bitline $BL_2$ can be grounded or connected to a bias potential through bitline contacts (not shown).

As will become more apparent from the discussion below, within the charge trapping layer 28, the memory device 10 includes a first charge trapping region or cell 36 (also referred to herein as a normal cell, a first charge storing cell or normal bit) adjacent one of the conductive regions (e.g., the bitline $BL_2$, which can function as the drain 16) and a second charge trapping region or cell 38 (also referred to herein as a complementary cell, a second charge storing cell or complementary bit) adjacent the other conductive region (e.g., the bitline $BL_1$, which can function as the source 14).

Each charge storing cell 36, 38 can independently have two data states. The data states can represent binary values, such as a logical zero and a logical one. The logical one, for example, can be implemented by leaving the desired charge storing cell 36, 38 in an unprogrammed state or blank programmed level. The logical zero, for example, can be implemented by storing an amount of charge in the desired charge storing cell 36, 38. This condition is also referred to as a charged state, a programmed state, a programmed level or a charged program level.

In the illustrated embodiment, the memory device 10 is a structurally symmetrical device, allowing for programming, verifying, reading, and erasing of the first charge storing cell 36 and the second charge storing cell 38 by respectively switching the roles of the bitlines $BL_1$, $BL_2$ (the source 14 and the drain 16) during those operations. Therefore, the bitlines $BL_1$, $BL_2$ will be referred to interchangeably by the terms source and drain, depending upon which of the normal bit 36 or the complementary bit 38 is being programmed, verified, read, or erased.

In one embodiment, the programming technique involves hot electron injection, also referred to as channel hot electron injection (CHE). However, it should be appreciated that modifications to the programming techniques can be made to accommodate variations in the specific memory device used.

Using hot electron injection, the first charge storing cell 36 can be programmed by applying a voltage potential (e.g., about +3.5 Volts to about +5 Volts) to the bitline $BL_2$ (functioning as the drain 16) and a voltage potential less than about +8 Volts (e.g., about +6 Volts to about +7.5 Volts) to the wordline WL (functioning as the gate electrode 32).

The other bitline $BL_1$ functions as the source 14 (i.e., source of electrons) for the CHE programming of the first charge storing cell 36. In one embodiment, a bias voltage potential is also applied to the source 14 (rather than grounding the source as found in conventional charge trapping dielectric flash memory devices). As a result of the application of a bias potential to the source 14 during programming, greater control over electron injection can be accomplished, which leads to enhanced data retention capability of the memory device 10.

The voltages applied to the gate electrode 32, the source 14 and the drain 16 generate a vertical electric field through the dielectric layers 26, 30 and the charge trapping layer 28 and a lateral electric field along the length of the channel 34 from the source 14 to the drain 16. At a given threshold voltage, the channel 34 inverts such that electrons are drawn off the source 14 and begin accelerating towards the drain 16. As the electrons move along the length of the channel 34, the electrons gain energy and, upon attaining enough energy, jump over the potential barrier of the bottom dielectric layer 26 and into the charge trapping layer 28, where the electrons become trapped.

As described above, the scaled down dielectric stack 24 facilitates the use of a reduced wordline WL voltage during CHE programming. In addition, as explained above, the thinner overall dielectric stack 24 under the wordline WL allows for better charge control in the substrate by the gate, which alleviates short channel effects (SCE) in the device, thus allowing for further device scaling.

The probability of electrons jumping the potential barrier is a maximum in the area of the first charge storing cell 36, adjacent the drain 16 (i.e., bitline $BL_2$), where the electrons have gained the most energy. These accelerated electrons are termed hot electrons and, once injected into the charge trapping layer 28, stay in the first charge storing cell 36 of the charge trapping layer 28. The trapped electrons tend not to spread laterally through the charge trapping layer 28 due to its low conductivity and low lateral electric field therein. Thus, the trapped charge remains localized in the charge trapping region of the first charge storing cell 36 close to the adjacent bitline $BL_2$.

The foregoing technique to program the first charge storing cell 36 can be used to program the second charge storing cell 38, but the functions of the bitlines $BL_1$ and $BL_2$ (i.e., source 14 and the drain 16) are reversed. However, as described above, a reduced wordline WL voltage (e.g., less than about +8 Volts) can be employed.

In one embodiment, once one or both of the charge storing cells 36, 38 are programmed with stored charge, one or both of the charge storing cells 36, 38 can be erased using the technique of hot hole injection (sometimes referred to as band-to-band (BTB) hot hole injection). However, it should be appreciated that modifications to the erasing techniques can be made to accommodate variations in the specific memory device used.

While the memory device 10 can include a scaled down dielectric stack 24, which facilitates reduced programming voltages and reduced SCE, the bottom dielectric layer 26 remains thick enough (e.g., about 60 angstroms to about 100 angstroms) to maintain desired data retention capabilities. In a hot hole injection erase, a negative voltage (e.g., about −3 Volts to about −6 Volts) is applied to the wordline WL, along with a drain 16 voltage on the order of about +4 Volts to about +6 Volts, while the source 14 is floated or grounded to erase the first charge storing cell 36. Conversely, the second charge storing cell 38 can be erased by floating the drain 116 and applying the above-referenced voltage potentials to the source 14 and the wordline WL.

It is worth noting that the use of the scaled down dielectric stack allows one to reduce the erase operating voltages as well. For example, in the embodiment described above, the scaled down dielectric stack facilitates the use of a negative wordline voltage that is about 25% smaller than that employed in conventional devices.

Application of these potentials creates a BTB tunnel current under the gate. Holes are generated under these conditions and accelerated from the N-type drain 16 region into the P-type body 18. The generated holes are accelerated in the electric field created near the P—N drain/body junction. Some of the accelerated holes surmount the bottom dielectric to silicon interface potential barrier between the substrate 12 and the bottom dielectric layer 26 and are injected into the charge trapping layer 28 to displace electrons (e.g., by recombination), thereby erasing the cell.

With continued reference to FIG. 1, one method of fabricating the memory device 10 will be described in greater detail. The method can begin by providing the semiconductor substrate 12. The semiconductor substrate 12 can be initially doped with P-type dopant (e.g., by implanting boron ions, gallium ions or indium ions). As indicated above, the initial substrate 12 doping can provide the desired conductivity for the body 18.

A layer of material used to form the bottom dielectric layer 26 can be grown or deposited on top of the substrate 12. In one embodiment, the bottom dielectric layer 26 can have a final thickness of about 60 angstroms to about 100 angstroms. As indicated above, the thickness of the bottom dielectric layer 26 remains thick enough to prevent low voltage leakage current and provide desirable data retention, for use with the hot hole injection erase operation described above. It is noted that the bottom dielectric layer 26 can optionally be used as an implant screen during the implantation of dopant species into the substrate 12. In this instance, the bottom dielectric layer 26 can be formed before initial substrate 12 implantation.

As indicated above, the bottom dielectric layer 26 can be formed from an appropriate dielectric material, such as silicon oxide (e.g., $SiO_2$), or a high-K material. High-K materials are materials having, in one embodiment, a relative permittivity of ten or higher and, in another embodiment, of twenty or higher. Although other high-K materials can be selected, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$), and barium strontium titanate (BST) are suitable high-K materials. In addition, all binary and ternary metal oxides and ferroelectric materials having a K higher than, in one embodiment, about twenty can be used for the bottom dielectric layer 26.

Following formation of the bottom dielectric layer 26, a layer of material used to form the charge trapping layer 28 can be formed on the bottom dielectric layer 26. In one embodiment, the charge trapping layer 28 can be formed from silicon nitride ($Si_3N_4$). Other suitable dielectric materials may also be used for the charge trapping layer 28. In one embodiment, the charge trapping layer 28 can have a final thickness of about 25 angstroms to about 50 angstroms.

On top of the charge trapping layer 28, the top dielectric layer 30 can be formed. Similar to the bottom dielectric layer 26, the top dielectric layer 30 can be made from an appropriate dielectric, such as silicon oxide (e.g., $SiO_2$), or a suitable high-K material. High-K materials are materials having, in one embodiment, a relative permittivity of ten or higher and, in another embodiment, of twenty or higher. However, the top dielectric layer 30 can be thinner (e.g., having a final thickness of, in one embodiment, about 40 angstroms to about 60 angstroms) than the bottom dielectric layer 26.

As described above, the bottom dielectric layer 26, the charge trapping layer 28, and the top dielectric layer 30 form a scaled down dielectric stack 24. In one embodiment, the dielectric stack 24 has a thickness of about 130 angstroms to about 170 angstroms, which can provide a critical dimension for reducing short channel effects (SCE) and allowing for a lower operating or programming voltage (e.g., less than +8 Volts) applied to the gate electrode 32.

On top of the top dielectric layer 30, a gate electrode layer 32 can be formed. The gate electrode layer 32 can be made from, for example, polycrystalline silicon ("poly") or another appropriate material such as a metal or metal oxide. In one embodiment, the gate electrode layer 32 can have a thickness of about 500 angstroms to about 3,000 angstroms.

The bottom dielectric layer 26, the charge trapping layer 28, the top dielectric layer 30, and, optionally, the gate electrode layer 32 can be uniformly formed across the substrate 12 in an area used to form a core array of memory devices 10. After the layers 26, 28, 30, and 32 have been formed, these layers can be patterned to form stacked gates. The patterning step can also be referred to as a bitline mask and etch step. A mask layer can be formed from, for example, a photoresist that is patterned using photolithographic techniques. The mask layer can be patterned into a series of lines and spaces where the lines cover the layers 26, 28, 30, and 32, where the stacked gates are formed, and the spaces expose the layers 26, 28, 30, and 32, where the bitlines $BL_1$, $BL_2$ will be formed.

The layers 26, 28, 30, and 32 can be etched in areas left exposed by the mask layer to expose the substrate 12. In an alternative embodiment, the bottom dielectric layer 26 is left in place as an implant screen.

Once the patterning and/or etching process is complete, an ion or dopant implantation process is carried out to form the buried bitlines $BL_1$, $BL_2$. In one embodiment, the buried bitlines are formed by the dopant implantation of an N-type dopant species (e.g., ions such as antimony, phosphorous or arsenic). It is to be appreciated that the stacked gate can function as a self-aligned mask for the dopant implantation.

In one embodiment, the buried bitlines are formed with sufficient N-type dopant implanted to provide $N^+$ conductivity. For example, in one embodiment, arsenic ion species can be implanted with an energy of about 30 keV to about 60 keV and a dose of about 1e13 atoms/cm$^2$ to about 4e15 atoms/cm$^2$. If desired, an anneal cycle (such as a rapid thermal anneal (RTA)) can be carried out to activate the dopant species of the buried bitlines $BL_1$, $BL_2$. The ion implantation energy can be of sufficient magnitude that the buried bitlines have a depth of at least 100 angstroms. It is noted that the dopant species may diffuse under the stacked gate during one or more subsequent anneal cycles to which the memory device 10 is subjected. Any such diffusion can be accounted for or otherwise controlled by controlling the implant energy, the implant dose, the anneal cycle parameters, pre-amorphization parameters and the like.

Sidewall spacers 35, if applicable, can be formed. The sidewall spacers 35 can be formed adjacent the lateral sidewalls of the stacked gate using a variety of techniques. For example, a layer of desired spacer material (e.g., silicon nitride, silicon oxide, silicon oxynitride, etc.) can be deposited to at least the height of the stacked gate. If desired, the spacer material can be polished (using, for example, chemical mechanical planarization or CMP) back to an upper surface of the gate electrode 32. Then, the spacer material can be anisotropically etched so that the sidewall spacers 35 remain. Next, the regions above the buried bitlines $BL_1$, $BL_2$ can be filled with an appropriate dielectric material (forming an interlayer dielectric, such as ILD-0).

Thereafter, in one embodiment, the wordlines WL can be formed. For example, a layer of polysilicon can be formed over the top dielectric layer 30 (or, optionally, over the already-existing gate electrode layer 32). The layer of polysilicon can be etched into the individual wordlines WL using a protective mask that is patterned using a photolithographic process. At this point, dielectric material, or a second interlayer dielectric (e.g., ILD-1), can optionally be formed between wordlines WL.

Thereafter, any additional processing to complete formation of the memory device 10 can be carried out. Such processing can include formation of bitline and/or wordline contacts, any additional dielectric layers, conductive layers, interconnect layers and so forth using conventional techniques.

As should be apparent, the foregoing method can be modified as desired to form desired properties of the memory device 10. For instance, the order of steps can be modified, certain steps can be omitted and/or additional steps can be added. In addition, the specified materials, doping parameters and so forth can be modified.

Although particular embodiments of the invention have been described in detail, it is understood that the invention is not limited correspondingly in scope, but includes all changes, modifications and equivalents coming within the spirit and terms of the claims appended hereto.

What is claimed is:

1. A memory device comprising:
   a substrate having a first semiconductor bitline and a second semiconductor bitline formed therein and a body region interposed between the first and second bitlines;
   a first dielectric layer disposed over the body region, said first dielectric layer having a thickness;
   a charge trapping dielectric layer disposed over the first dielectric layer;
   a second dielectric layer disposed over the charge trapping layer; said second dielectric layer having a thickness less than the thickness of the first dielectric layer; and a wordline disposed over the second dielectric layer and electrically defining a channel within the body region.

2. The memory device according to claim 1, wherein the charge trapping layer has a thickness of about 30% to about 75% of the thickness of the first dielectric layer.

3. The memory device according to claim 1, wherein the thickness of the second dielectric layer is about 50% to about 100% of the thickness of the first dielectric layer.

4. The memory device according to claim 1, wherein the first dielectric layer has a thickness of about 60 angstroms to about 100 angstroms.

5. The memory device according to claim 4, wherein the charge trapping layer has a thickness of about 25 angstroms to about 50 angstroms.

6. The memory device according to claim 5, wherein the second dielectric layer has a thickness of about 40 angstroms to about 60 angstroms.

7. The memory device according to claim 1, wherein the first dielectric layer, the second dielectric layer and the charge trapping layer form a dielectric stack having a thickness of about 130 angstroms to about 170 angstroms.

8. The memory device according to claim 7, wherein the charge trapping layer has a conductivity such that at least a first charge can be stored in a first charge trapping cell adjacent the second bitline and at least a second charge can be stored in a second charge trapping cell adjacent the first bitline; and the dielectric stack is effective to increase the probability that charge will be stored in at least one of the first and second charge trapping cells upon application of a voltage potential of less than about +8 Volts to the wordline.

9. A method of programming the memory device according to claim 7, said method including:

applying a program voltage of less than about +6 Volts to about +8 Volts to the wordline;

applying a voltage potential of about +3.5 Volts to about +5 Volts to the first bitline; and connecting the second bitline to a zero potential.

10. The memory device according to claim 7, said memory device being operative to be erased by a hot hole injection erase operation, said erase operation including:

applying an erase voltage of about −3 Volts to about −6 Volts to the wordline;

applying a voltage potential of about +4 Volts to about +6 Volts to the first bitline; and one of (i) connecting the second bitline to a zero potential, and (ii) floating the second bitline.

11. A memory device comprising:

a semiconductor substrate;

a source and a drain formed from bitlines disposed on or within the semiconductor substrate, said source and drain defining a body region therebetween;

a charge trapping dielectric stack having a thickness of about 130 angstroms to about 170 angstroms formed over the body region, said charge trapping dielectric stack including:

a bottom dielectric layer disposed over the body region;

a charge trapping dielectric layer disposed over the bottom dielectric layer; and a top dielectric layer disposed over the charge trapping dielectric layer; and a gate electrode formed from a wordline disposed over the charge trapping dielectric stack, said gate electrode electrically defining a channel within the body region.

12. The memory device according to claim 11, wherein the top dielectric layer has a thickness less than a thickness of the bottom dielectric layer.

13. The memory device according to claim 11, wherein the charge trapping dielectric layer has a thickness of about 25 angstroms to about 50 angstroms.

14. The memory device according to claim 13, wherein the bottom dielectric layer has a thickness of about 70 angstroms to about 100 angstroms.

15. The memory device according to claim 14, said memory device being operative to be erased by a hot hole injection erase operation.

16. The memory device according to claim 12, wherein the charge trapping layer has a conductivity such that at least a first charge can be stored in a first charge trapping cell adjacent the drain and at least a second charge can be stored in a second charge trapping cell adjacent the source; and the dielectric stack is effective to increase the probability that charge will be stored in at least one of the first and second charge trapping cells upon application of a voltage potential of less than about +8 Volts to the gate electrode.

17. A method of programming the memory device according to claim 11, said method including:

applying a program voltage of about +6 Volts to about +8 Volts to the gate electrode;

applying a voltage potential of about +3.5 Volts to about +5 Volts to the drain; and connecting the source to a zero potential.

18. A method of erasing the memory device according to claim 11, said method including:

applying an erase voltage of about −3 Volts to about −6 Volts to the gate electrode;

applying a voltage potential of about +4 Volts to about +6 Volts to the drain; and one of (i) connecting the source to a zero potential, and (ii) floating the source.

19. A method of programming a non-volatile memory device having a pair of buried bitlines disposed within a semiconductor substrate, said buried bitlines defining a body region therebetween, a bottom dielectric layer formed over the body region, a charge storing layer formed over the bottom dielectric layer, said charge storing layer having a conductivity such that at least a first charge can be stored in a first charge storing cell adjacent a first buried bitline and at least a second charge can be stored in a second charge storing cell adjacent a second buried bitline, a top dielectric layer formed over the charge storing layer, and a wordline formed over the top dielectric layer, said method comprising:

applying a program voltage of less than about +8 Volts to the wordline;

applying a voltage potential of about +3.5 Volts to about +5 Volts to the first bitline; and connecting the second bitline to a zero potential.

20. The method according to claim 19, wherein the bottom dielectric layer, the top dielectric layer and the charge storing layer form a dielectric stack having a thickness of about 130 angstroms to about 170 angstroms.

21. The method according to claim 20, wherein the step of applying a program voltage includes:

connecting the wordline to a voltage potential of about +6 Volts to about +7.5 Volts.

* * * * *